(12) United States Patent
Jin (10) Patent No.: US 10,594,300 B2
(45) Date of Patent: Mar. 17, 2020

(54) DIGITAL PHASE LOCKED LOOP CLOCK SYNTHESIZER WITH IMAGE CANCELLATION

(71) Applicant: Microsemi Semiconductor ULC, Kanata (CA)

(72) Inventor: Qu Gary Jin, Kanata (CA)

(73) Assignee: Microsemi Semiconductor ULC, Kanata (CA)

(*) Notice: Subject to any disclaimer, the term of this patent is extended or adjusted under 35 U.S.C. 154(b) by 0 days.

(21) Appl. No.: 16/153,157

(22) Filed: Oct. 5, 2018

(65) Prior Publication Data

US 2019/0123723 A1 Apr. 25, 2019

Related U.S. Application Data

(60) Provisional application No. 62/576,683, filed on Oct. 25, 2017.

(51) Int. Cl.
| | |
|---|---|
| H03H 17/04 | (2006.01) |
| H03L 7/093 | (2006.01) |
| H03L 7/099 | (2006.01) |
| H03H 17/06 | (2006.01) |
| H03H 17/02 | (2006.01) |

(52) U.S. Cl.
CPC ......... *H03H 17/0444* (2013.01); *H03L 7/093* (2013.01); *H03L 7/0991* (2013.01); *H03L 7/0994* (2013.01); *H03H 17/026* (2013.01); *H03H 17/0657* (2013.01); *H03L 2207/50* (2013.01)

(58) Field of Classification Search
CPC .................................................. H03H 17/0444
USPC ............................................................ 331/2
See application file for complete search history.

(56) References Cited

U.S. PATENT DOCUMENTS

| | | | |
|---|---|---|---|
| 2008/0315928 A1* | 12/2008 | Waheed | G04F 10/005 327/159 |
| 2017/0194973 A1* | 7/2017 | Moehlmann | G01S 7/35 |
| 2017/0371990 A1* | 12/2017 | Wiklund | G06F 17/5036 |

* cited by examiner

*Primary Examiner* — Joseph Chang
(74) *Attorney, Agent, or Firm* — Glass and Associates; Kenneth Glass (57) ABSTRACT

A frequency synthesizer includes a hardware digital controlled oscillator (HDCO) running at a first clock rate $f_S$ for generating an output clock signal in response to a control input, and a digital phase locked loop (DPLL) responsive to a reference input sampled at a second clock rate $f_{samp}$, the first clock rate $f_S$ being N times greater than the second clock rate $f_{samp}$. The DPLL includes a loop filter and a software digital controlled oscillator (SDCO). A first, first order linear interpolation anti-imaging filter running at a clock rate higher than said second clock rate $f_{samp}$ is coupled to an output of the loop filter for providing the control input to the HDCO. A second, first order linear interpolation anti-imaging filter running at said second clock rate coupled to the output of said loop filter to provide an input to said SDCO.

22 Claims, 8 Drawing Sheets

Fig. 1

PRIOR ART

DIGITAL PHASE LOCKED LOOP CLOCK SYNTHESIZER WITH IMAGE CANCELLATION

FIELD OF THE INVENTION

This invention relates to the field of precision timing, and in particular to a Digital Phase Locked Loop (DPLL) clock synthesizer for deriving an output clock signal from a reference signal, and a method of deriving such an output clock signal.

BACKGROUND OF THE INVENTION

It is known to employ a DPLL locked to a reference signal, for example a primary reference clock signal, to drive a hardware digitally controlled oscillator DCO (HDCO) generating the output clock signal. The reference signal is sampled at a sampling rate $f_{samp}$ and fed into a DPLL comprising a phase comparator 12, a loop filter 14, and a software digitally controlled oscillator (SDCO) 18. The interrupt or sampling rate of the DPLL is the same as the sampling rate $f_{samp}$ of the reference signal.

The loop filter generates an error value $\Delta f$ for the SDCO, which error value $\Delta f$ is also used to control the HDCO, which HDCO is essentially a modulo n counter that generates an output clock pulse on each rollover of the counter.

Figure 2:
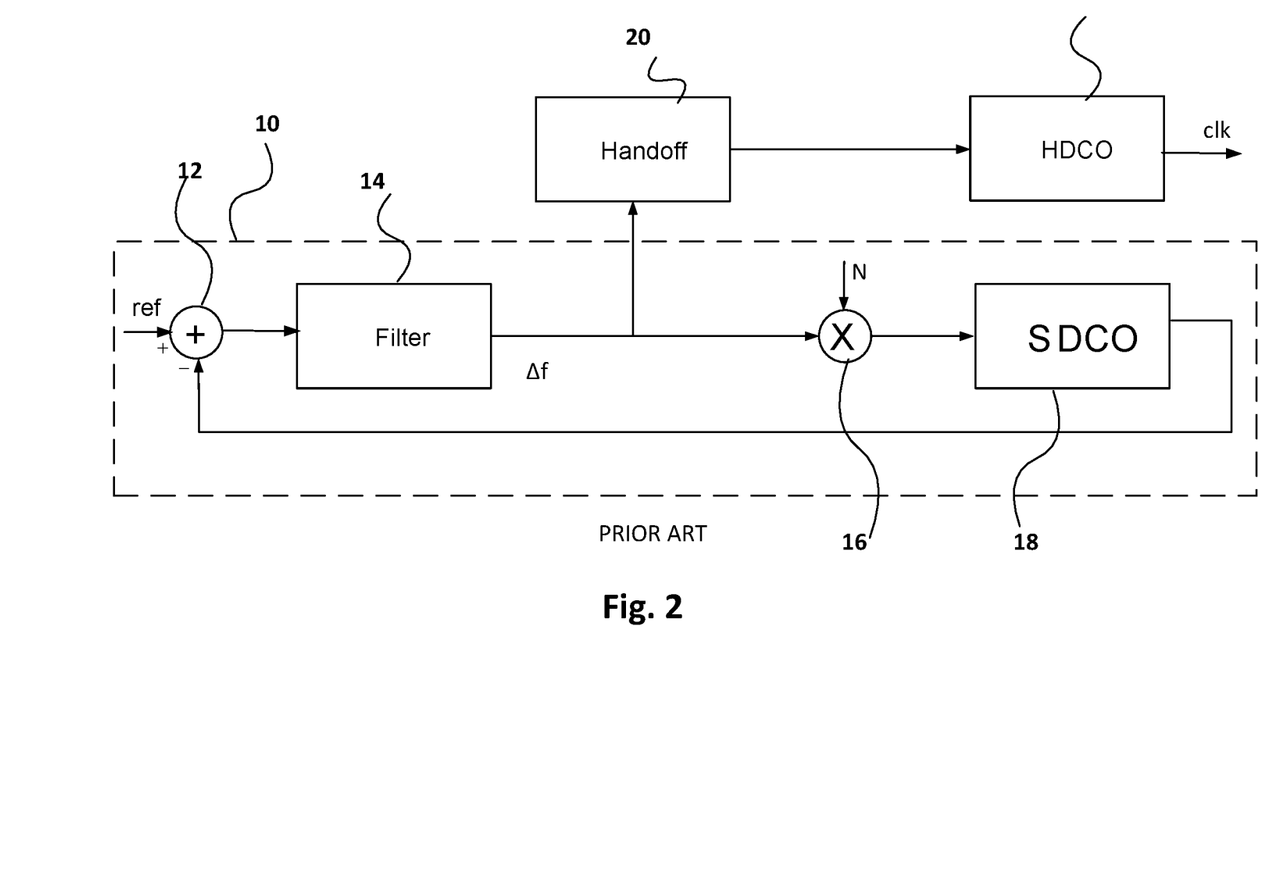
FIG. 2 is a block diagram of a prior art clock synthesizer with a DPLL.

A schematic diagram of a prior art DPLL 10 running at the sampling rate $f_{samp}$ is shown in FIG. 2. The reference input value ref, which is a sampled version of the reference clock signal, is applied to the phase comparator 12, the output of which is applied to the loop filter 14, which in turn outputs frequency error value $\Delta f$. This error value is applied to a multiplier-by-N 16, which provides a control input to the SDCO 18 whose output provides the second input to the phase comparator 12.

The output of the loop filter 14 is also applied to handoff block 20, which provides the input to the HDCO 22 generating the output clock signal clk. As noted the HDCO 22 is typically in the form of a modulo n counter, wherein the value loaded in the counter determines phase and the addend determines frequency.

Since the HDCO 22 generates the output clock signals clk, it runs at a rate $f_s$ that is N times faster than the sampling rate $f_{samp}$, where N is typically a large number. For example, for a sampling rate of 3.5 KHz, $f_s$ might be 200 MHz, in which case N=57344. The purpose of the multiplier-by-N 16 is to maintain synchronism with the HDCO 22 as explained with reference to FIG. 3.

Figure 3:
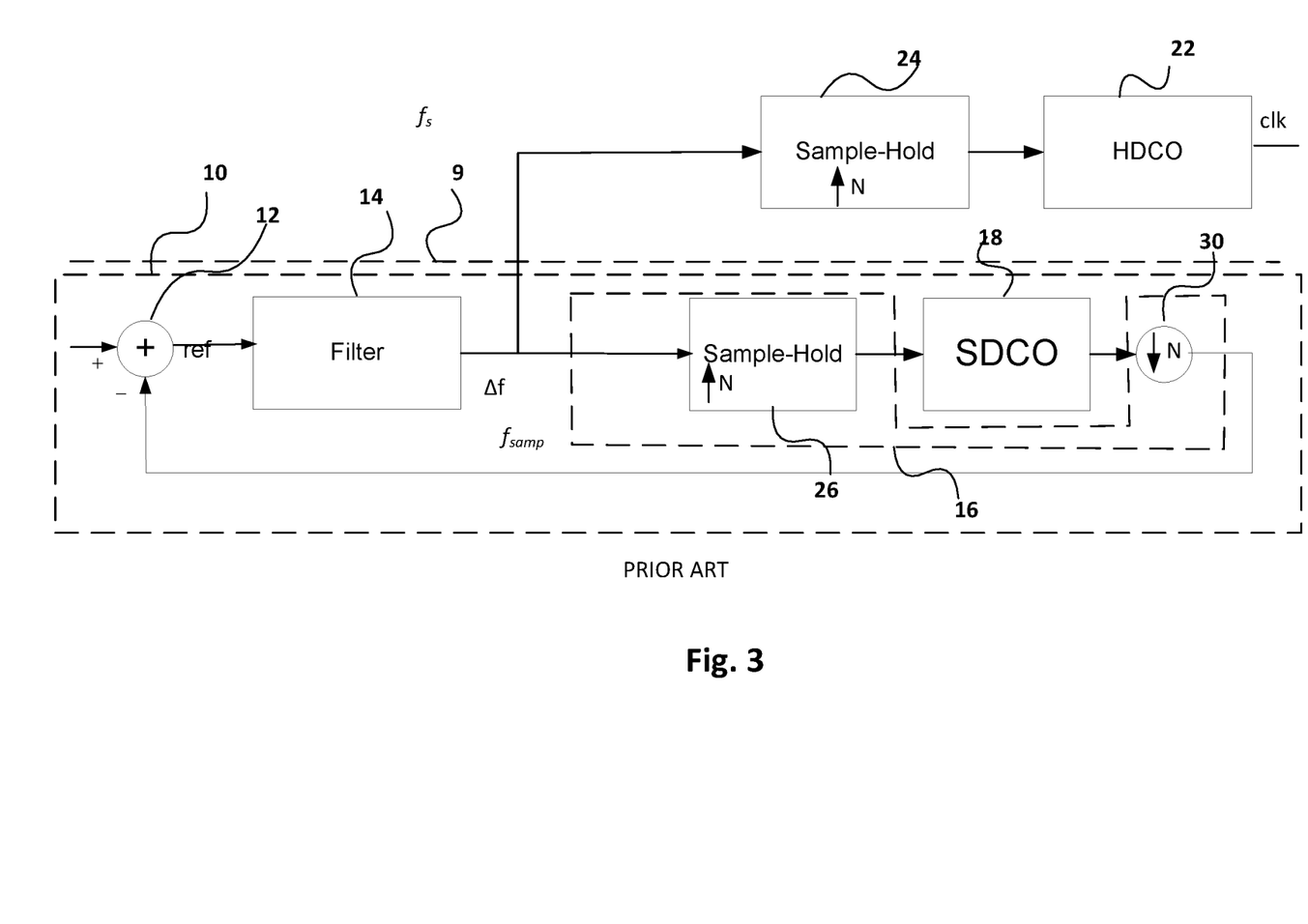
FIG. 3 is an equivalent circuit of the clock synthesizer shown in FIG. 2.

An equivalent circuit for the structure of FIG. 2 is shown in FIG. 3 wherein the handoff block 20 is shown as a sample-hold register 24, which upsamples the data by N. The high rate domain running at clock rate fs is separated from the low rate domain running at clock rate $f_{samp}$ by the dashed line 9. All the components above the dashed line run at the high rate $f_s$, and all the components below the dashed line 9 run at the low rate $f_{samp}$, although as will be explained in more detail below the action of multiplier 16 in FIG. 2, shown as in dashed lines as its equivalent in FIG. 3, is to simulate the effect of running at the high rate $f_s$ even though the SDCO is actually running at the low rate $f_{samp}$.

In FIG. 3 the frequency control value $\Delta f$ is upsampled and held by sample-hold register 24 for the duration of N clock cycles at the high rate $f_s$, which is the same as one clock cycle at the low rate $f_{samp}$.

In order to achieve upsampling, a sample at the low sampling rate $f_{samp}$ is loaded into the sample-hold register 24 and repeatedly output for N clock cycles at the high sampling rate $f_s$ as represented by the symbol ↑ N.

On the next clock cycle at the low rate $f_{samp}$, the next sample is loaded in to the sample-hold register 24, and so on. As a result, during one clock cycle of the DPLL 10, the HDCO 22 will be shifted by a frequency N*$\Delta f$. Thus to maintain synchronism between the SDCO 18 and the HDCO 22, the input control frequency to the SCDO 18 is multiplied by N. This operation, namely multiplying by N, is the equivalent to holding the sample $\Delta f$ for N clock cycles at the high rate in sample-hold register 26 by the upsampling of sample-hold register 26, updating the frequency by $\Delta f$ for each clock cycle at the higher rate by SDCO 18, and downsampling by N downstream of the SDCO 18 in downsampler 30. The result will be the same in both FIG. 2 and FIG. 3 in that that during one clock cycle at the rate $f_{samp}$, the SDCO 18 will be shifted by N*$\Delta f$ and thus maintain synchronism with the HDCO 22. Thus, it will be appreciated that in FIG. 3, the function sample-hold register 26 and downsampler 30 shown in the equivalent circuit is in the real-world performed by the multiplier-by-N 16 in FIG. 2.

Figure 1:
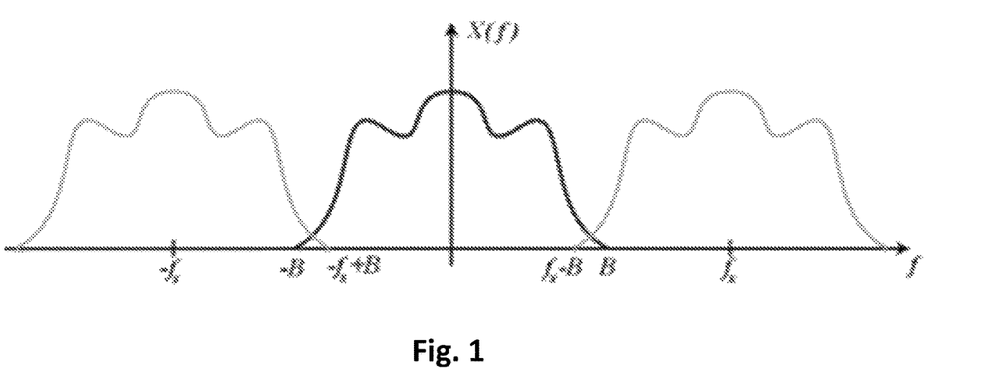
FIG. 1 shows the spectral images that arise from the upsampling process.

A well-known general problem arises as a result of the upsampling process of sample-hold register 26 as shown in FIG. 1. Spectrum images are created in the high frequency bands on either side of the desired signal. In order to remove the spectrum images a low-pass filter is required.

In general terms, upsampling from a low rate to a high rate N times higher than the low rate involves outputting each sample once at the high rate at the start of each low-rate clock cycle, and outputting zero values for the remaining N−1 clock high-rate clock cycles of the current low-rate clock cycle. In this case, however, the sample-hold register 24 does not output N−1 zero values after the current sample value has been output at the high rate, but instead continues to output the current sample until the end of the current-low rate clock cycle. The net result is that the current sample is output N times at the high rate during each low-rate clock cycle. This result is equivalent to passing the raw upsampled data, wherein the data is stuffed with N−1 zeros following each sample, through a FIR filter containing N values that are all "1". Such a filter is a zero-order FIR filter. Consequently, the sample-hold register 24 is equivalent to a combined upsampler and zero-order low pass filter, and thus serves as an anti-image filter. Similar reasoning applies to the sample-register 26 except of course in this case, the sample-hold register 26 is virtual, rather than real since it only appears in the equivalent circuit for the multiplier-by-N 16.

The anti-imaging filter frequency response for a zero-order low-pass FIR filter is:

$\sin(\pi f N/f_s)/(N^* \sin(\pi f/f_s))$ where $f_s$ is HDCO system clock and N is the ratio between system clock and SDCO sampling clock (N=$f_s/f_{samp}$). The HDCO has a phase transfer function of $$H_{dco}(Z) = \frac{1}{1-Z^{-1}}$$

which behaves like a low pass filter for phase noise.

The closed loop frequency response of the DPLL, which can be obtained from FIG. 2, is:

$$H(z) = \frac{H_l(Z^{-1})}{1+H_l(Z^{-1})-Z^{-1}}$$

where $H_f(Z^{-1})=N*$Filter, and Filter is the transfer function of the loop filter 14.

Figure 4:
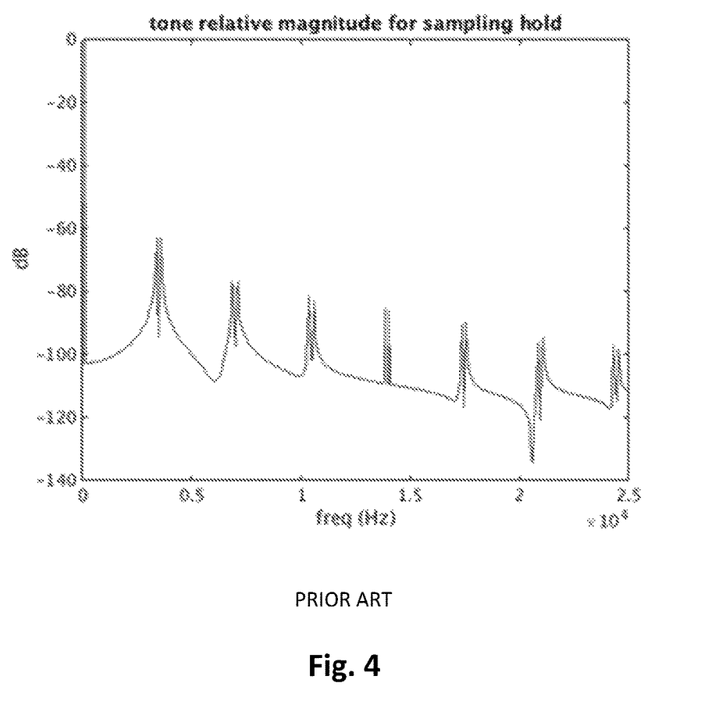
FIG. 4 is a plot of tone magnitude against frequency for a clock synthesizer with a zero-order upsampling filter.

FIG. 4 shows simulated example using a zero-order low-pass FIR filter for fs=200 MHz and N=57344 (sampling frequency $f_{samp}$=3.5 KHz) with 100 Hz in-band wander noise. It will be seen that there are still significant harmonics, which manifest themselves as phase noise. The first harmonic for 100 Hz in-band tone is at 3.5 KHz+/−100 Hz, which has a magnitude about 60 dB below the tone value at 100 Hz. In this example there is a 60 dB reduction for every doubling of the sampling rate. The zero-order anti-image filter and the HDCO frequency response contribute equally to the 60 dB harmonic reduction (i.e. 30 dB each).

SUMMARY OF THE INVENTION

Embodiments of the invention improve the image reduction by providing a first order linear interpolation filter in both the low and high rate clock domains. The use of a first order linear interpolation filter improves image reduction while avoiding instabilities in the DPLL that might otherwise arise.

According to the present invention there is provided a frequency synthesizer, comprising: a hardware digital controlled oscillator (HDCO) running at a first clock rate $f_S$ for generating an output clock signal in response to a control input; a digital phase locked loop (DPLL) responsive to a reference input sampled at a second clock rate $f_{samp}$, said first clock rate $f_S$ being N times greater than said second clock rate $f_{samp}$, and said DPLL comprising a loop filter and a software digital controlled oscillator (SDCO); a first, first order linear interpolation anti-imaging filter running at a clock rate higher than said second clock rate $f_{samp}$ coupled to an output of said loop filter for providing said control input to said HDCO; and a second, first order linear interpolation anti-imaging filter running at said second clock rate coupled to the output of said loop filter to provide an input to said SDCO.

In one embodiment the clock synthesizer includes an accumulator running at the first clock rate, which incrementally adds fractions of the difference between the current output of the loop filter and the output of the loop filter on the previous sample to the value of the previous output of the loop filter during each clock cycle at the second rate so as to linearly increase the value input to the HDCO over one clock cycle at the second rate.

In another embodiment, in order to save hardware cost, the accumulator runs at an intermediate rate between the first rate and the second rate. The incrementing output is upsampled to the first rate prior to application to the HDCO. Compensation circuitry to maintain synchronization between the SDCO and the HDCO is included in the DPLL loop.

In yet another embodiment the SDCO provides phase updates directly to the HDCO through a sample-hold block, which runs at the first rate.

According to another aspect of the invention there is provided a method of synthesizing a clock signal from a reference signal, comprising sampling said reference signal at a clock rate $f_{samp}$; locking a digital phase locked loop (DPLL) including a loop filter and software digital controlled oscillator (SDCO) to said sampled reference signal; generating said clock signal from a hardware digital controlled oscillator (HDCO) running at a clock rate $f_S$, where $f_S=N*f_{samp}$; deriving a control input for said HDCO by passing an output of said loop filter through a first, first order linear interpolation anti-imaging filter running at a clock rate higher than said clock rate $f_{samp}$; and passing the output of said loop filter through a second, first order linear interpolation anti-imaging filter running at said clock rate $f_{samp}$ to provide an input to said SDCO.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

It will be appreciated that the present invention falls in the realm of digital signal processing, and there are a number of equivalent ways of representing the same processes and components. For example, as explained above, multiplying samples by N at one rate and then passing them through an SDCO at a given rate is equivalent to upsampling, passing the samples through the SDCO at a rate equal to N times the given rate, wherein N is normally an integer, and subsequently downsampling. The use of a particular representation is not intended to be limiting, and the invention covers all equivalent representations of a particular process or block diagram. Likewise, it will be appreciated that an operation illustrated as /2 followed by xN could equally well be performed in one step as xN/2.

Figure 5:
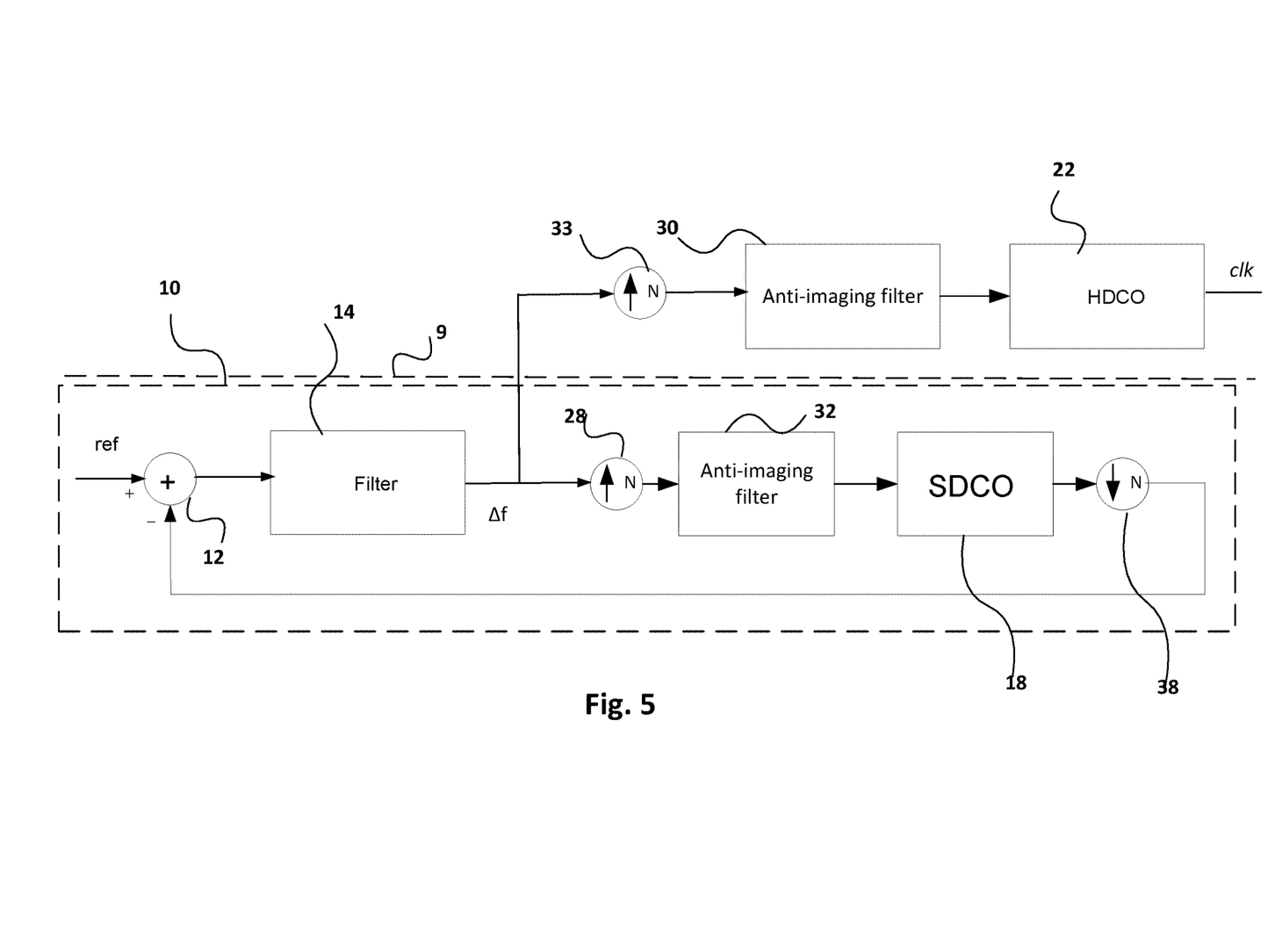
FIG. 5 is an equivalent diagram of a clock synthesizer with an added anti-imaging filter.

FIG. 5 shows a generic equivalent circuit of a clock synthesizer with anti-imaging filters, wherein the output Δf of the loop filter is passed through upsampler 33 to an anti-imaging filter 30 and through upsampler 28 to the anti-imaging filter 32. In general terms, if we consider the low rate domain as comprising the DPLL 10 and the high rate domain above dashed line 9 as including the HDCO 22, imaging can be reduced by placing the anti-imaging filters 30, 32 associated with respective upsamplers 28, 33 upstream of the HDCO 22 and SDCO 18. As noted in the discussion with reference to FIG. 3, in the prior art a sample-hold register serves as a combined upsampler and zero-order anti-imaging filter for the high rate domain, and in the case of the low rate domain the multiplier-by-N of FIG. 3 is equivalent to the upsampler 28, anti-imaging filter 32, and downsampler 38 with the SDCO 18 notionally running at the high rate, although in reality the SDCO 18 continues to run at the low rate $f_{samp}$, with the high rate being simulated by simply multiplying the input by N, where N is the ratio of the high rate $f_s$ to the low rate $f_{samp}$.

More effective anti-imaging can be achieved by modifying the design of the anti-imaging filters 30, 32. Whenever an anti-imaging filter is added in the high rate domain, the same type of filter must be added to the DPLL 10 in order to maintain synchronization between the HDCO 22 and the SDCO 18. If different types of filter are employed, synchronization will be lost. The problem is that the presence of the anti-image filter changes the behavior of the DPLL 10. A complicated and effective filter will tend to make the DPLL loop unstable. Also, since upsampling and downsampling are non-linear operations, they will also make the DPLL 10 behave in a non-linear fashion, as a result of which the DPLL can become uncontrollable.

Furthermore, since the anti-image filter 30 runs at the high system clock rate, a complicated filter can be very costly to implement in hardware.

However, if the anti-image filters 30, 32 are first order linear interpolation filters, the inventor has found that enhanced image reduction can be achieved without incurring the instability problems noted above.

Figure 6:
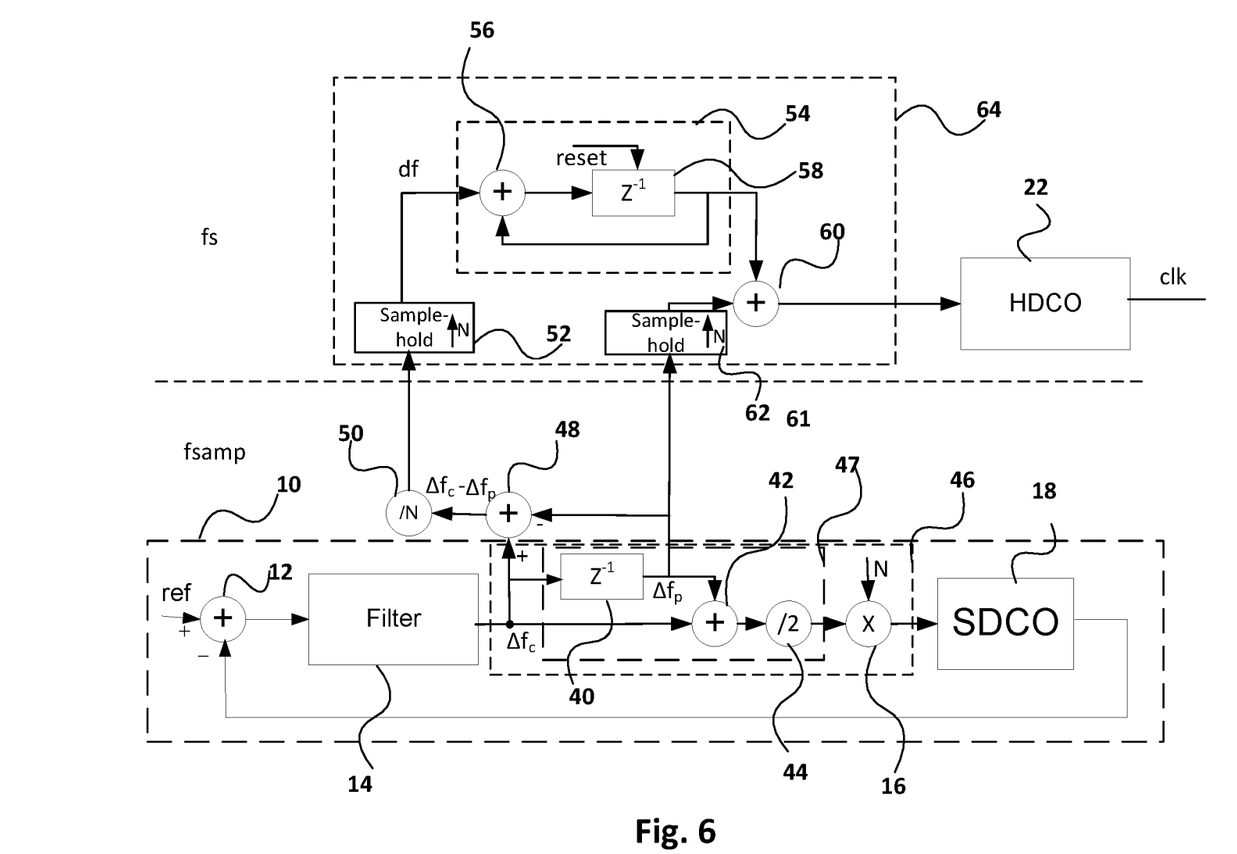
FIG. 6 is a block diagram of a clock synthesizer with a first order upsampling filter in accordance with a first embodiment of the invention.

An embodiment implementing first order linear interpolation anti-imaging filters is shown in FIG. 6.

The current output sample $\Delta f_c$ of the loop filter 14 is applied to the input of unit delay memory 40 and to a first input of adder 42 whose second input receives the previous sample $\Delta f_p$, from the unit delay memory 40. The output of the adder 42 $\Delta f_c + \Delta f_p$ is divided by 2 in divider 44 to derive the average of the current sample $\Delta f_c$ and previous sample $\Delta f_p$ in averaging block 47, which outputs the average to multiplier-by-N 16, the averaging block 47 and multiplier-by-N thus acting as a first order linear filter 46. The averaging block 47 acts as a first order filter for reasons known in the art. The multiplier-by-N 16 acts as a zero order filter as explained above, and thus does not change the overall order of the combination of the averaging block 47 and multiplier-by-N 16, which together act as a first order filter.

At the start of each low-rate clock cycle, the current output $\Delta f_c$ of the loop filter 14 is further applied to the plus input of adder 48 whose minus input is coupled to the output of the unit delay memory 40. The adder 48 outputs the difference $\Delta f_c - \Delta f_p$ between the current and previous samples. This difference $\Delta f_c - \Delta f_p$ is then divided by N in divider 50 to derive the value df before being loaded into sample-hold register 52 running at the high clock rate $f_s$.

The contents df=$\Delta f_c - \Delta f_p$/N of the sample-hold register 52 are then output N times on each clock cycle of the higher clock rate $f_s$ and applied to the input of accumulator block 54 comprising adder 56 and unit delay memory 58. In particular, the value df is applied to a first input of adder 56. The contents of the unit delay memory 58 increment by df on each $f_s$ clock cycle up to $\Delta f_c - \Delta f_p$, whereupon the unit delay memory 58 is reset at the start of the next clock cycle $f_{samp}$. The output of the accumulator 54, presented by the output of the unit delay memory 58, is applied to a first input of adder 60 and to a second input of adder 56.

The value of the previous sample $\Delta f_p$ is loaded into sample-hold register 62 running at the high rate $f_s$ at the start of each clock cycle at the low rate and applied to a second input of adder 60. As described above, the contents $\Delta f_p$ of sample-hold block are then output on each clock cycle at the high rate $f_s$ to the first input of adder 60, which produces an output that during each interrupt cycle at the rate $f_{samp}$ linearly increments from $\Delta f_p$ to $\Delta f_c$. The block 64 comprising sample-hold register 52, accumulator 54, sample-hold register 62, and adder 60 constitutes a first order linear interpolation filter.

As in the previous figure it will be appreciated that upsampling is performed by loading the values df, $\Delta f_p$ once for each low-rate clock cycle into the respective sample-hold registers 52, 62 and outputting them N times at the high rate.

In the embodiment shown in FIG. 6 the DPLL 10 remains linear as it does not contain a non-linear block. As noted, the frequency feed of the SDCO 18 is the average of current DPLL loop filter 14 output and previous output $\Delta fc + \Delta fp/2$ with multiplier factor of N. The closed loop DPLL frequency response is:

$$H(z) = \frac{H_l(Z^{-1})\left(\frac{1+Z^{-1}}{2}\right)}{1 + \frac{1}{2}H_l(Z^{-1}) - \left(1 - \frac{1}{2}H_l(Z^{-1})\right)Z^{-1}}$$

When $H_l(Z^{-1})$, which is the transfer function of the loop filter 14, is constant, i.e. a zero order filter, which is the case for normal filter without an integrating part, the transfer function of the DPLL 10 remains first order with one zero and one pole. However, if the loop filter 14 is a first order filter, i.e. it includes the I-part, the DPLL 10 becomes second order. In general, if the loop filter 14 is an nth order filter, the DPLL will be (n+1)th order DPLL, which is one order higher than the original DPLL in FIG. 2.

Figure 7:
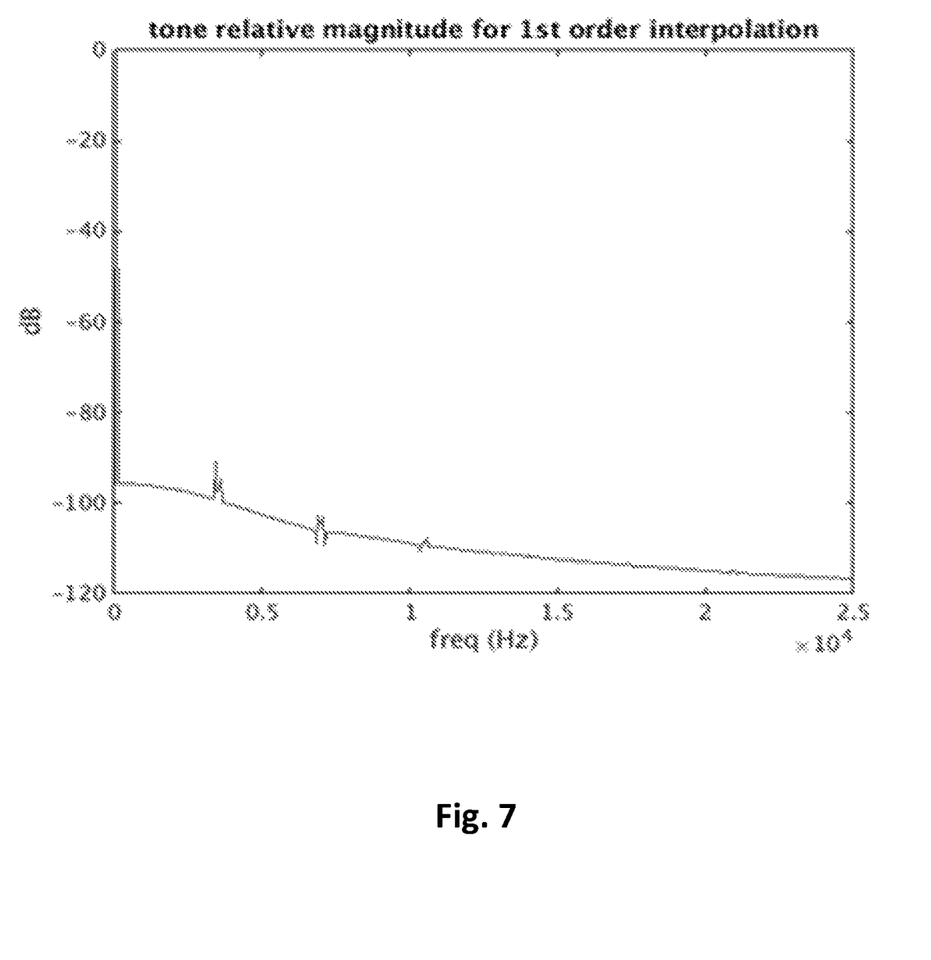
FIG. 7 is a plot of tone magnitude against frequency for a clock synthesizer with a first-order upsampling filter as shown in FIG. 6.

FIG. 7 shows the simulation results with the same setting as shown in FIG. 4 except using the first order anti-image filter architecture of FIG. 6 instead of the zero-order anti-image filter of FIG. 3.

It will be observed in FIG. 7 that the first tone in HDCO phase noise is further reduced by 30 dB, i.e., from −60 dB to −90 dB.

The required changes in hardware relative to the prior art are modest. At every interrupt pulse, the sample-hold registers 62, 52 provide the initial frequency $\Delta f_p$ and the increment df. The extra circuit cost for frequency interpolation is limited because df is a small fraction of the control frequency input to the HDCO 22 and only relatively modest accumulation hardware is required. The difference df has much smaller dynamic range than the current HDCO control frequency.

The main cost in terms of hardware in the embodiment of FIG. 6 is the accumulator 54 and extra adder 60 that are running at the high clock rate $f_s$.

In subsequent embodiments like components performing similar functions, but running at a different clock rate are indicated by like reference numerals with an added prime.

Figure 8:
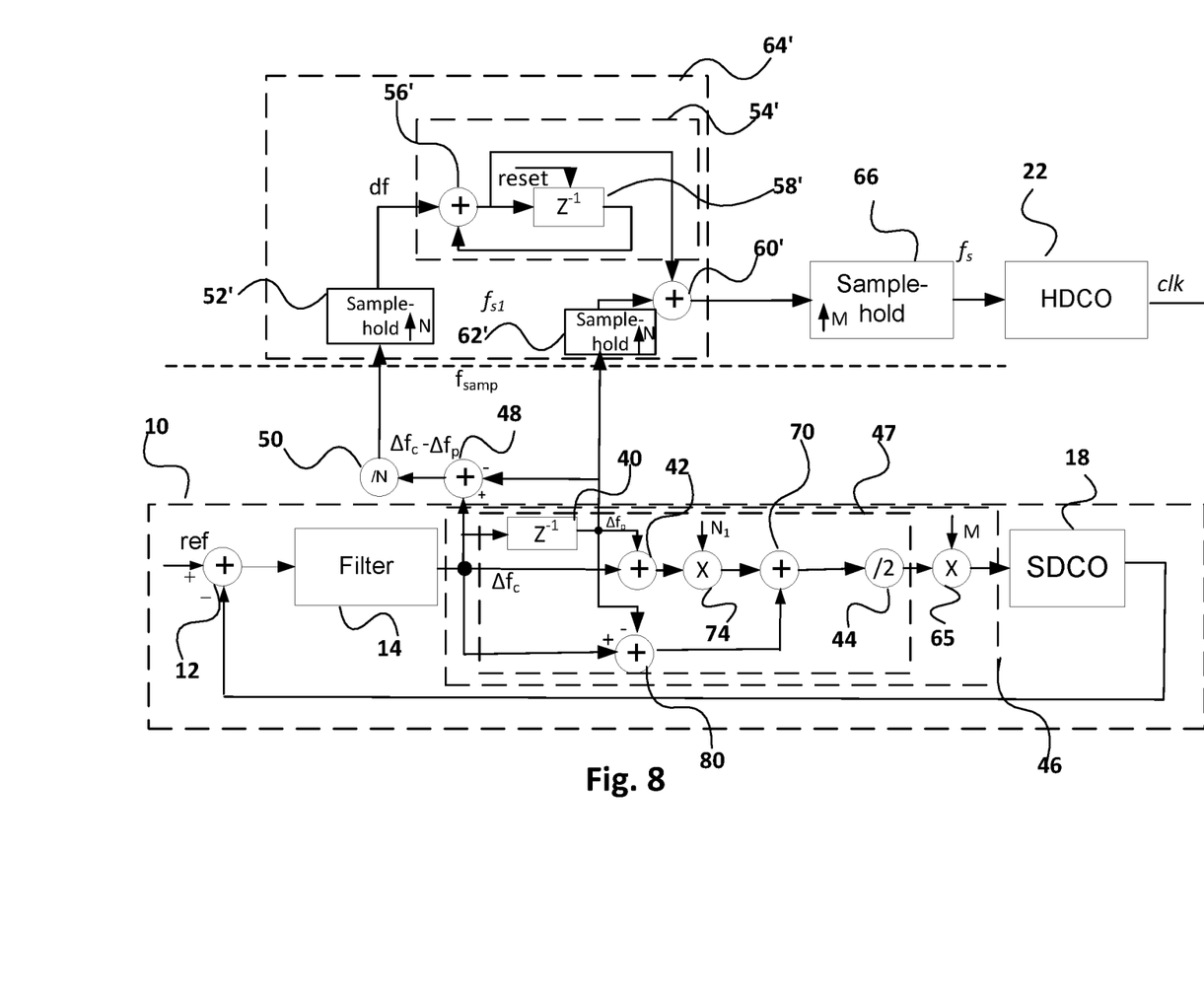
FIG. 8 is a block diagram of a clock synthesizer with a first order upsampling filter in accordance with a second embodiment of the invention.

In the embodiment shown in FIG. 8, the accumulator 54' and adder 60' run at an intermediate rate $f_{s1}$, which may be selected according to system requirements. The choice of intermediate frequency $f_{s1}$ is based on the jitter requirement and the hardware implementation. The phase noise should be small enough that it is out of the jitter frequency band for the output clock. As a non-limiting example, $f_{s1}$ could be 12.5 MHz.

As in the previous example, the values df, $\Delta f_p$ are upsampled by outputting the values from the sample-hold registers 52', 62' on each clock cycle at the rate $f_{S1}$.

The output of the adder 60' is then loaded into the sample-hold register 66 and output to the HDCO 22 at the rate $f_s$, which is equivalent to upsampling by a factor M, where $M=f_s/f_{s1}$. The block 67 forms a zero-order filter downstream of the first order linear filter 64'.

In the embodiment of FIG. 8, the input to the adder 60' is taken from the input to the unit delay memory 58.

In order to maintain synchronism between the HDCO 22 and the SDCO 18, the DPLL structure is changed. In this embodiment the output of the adder 42 $\Delta f_c + \Delta f_p$ is multiplied by $N_1$, where $N1 = N/M = f_{s1}/f_{samp}$ and added by adder 70 to the difference $\Delta f_c - \Delta f_p$ obtained in subtractor 80 before being divided by two and multiplied by M. If we notionally remove the adder 70, the circuit becomes a first order filter at rate N1 followed by a zero order filter at rate M The adder 70 is required to apply a small correction to maintain synchronism.

Once again, there is no non-linear circuit in the DPLL loop and the frequency response will be very similar to the one in FIG. 6, which is:

$$H(z) = \frac{H_l(Z^{-1})\left(\frac{(N_1+1)+(N_1-1)Z^{-1}}{2N_1}\right)}{1+\frac{N_1+1}{2N_1}H_l(Z^{-1})-\left(1-\frac{N_1-1}{2N_1}H_l(Z^{-1})\right)Z^{-1}}$$

Figure 9:
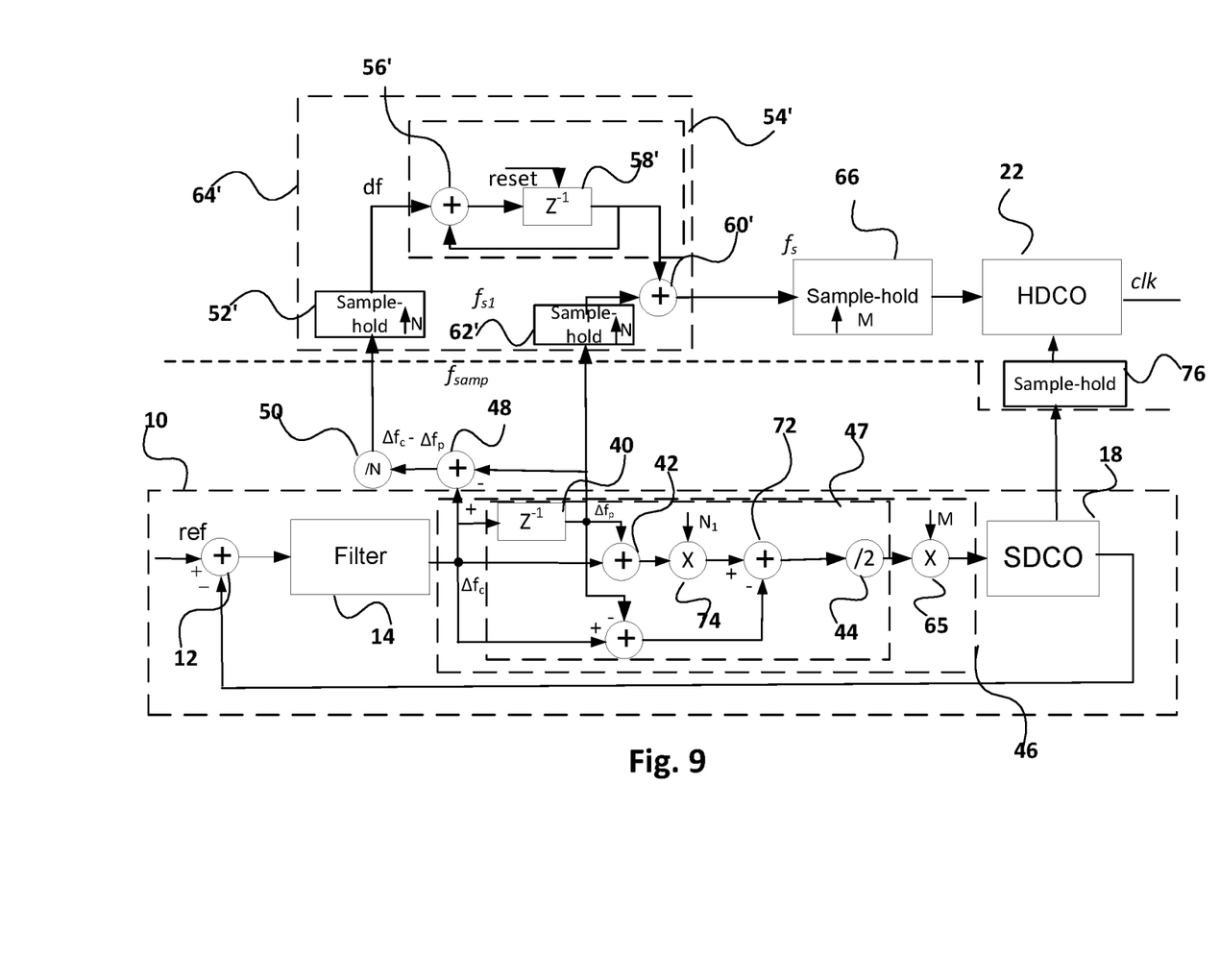
FIG. 9 is a block diagram of a clock synthesizer with a first order upsampling filter in accordance with a third embodiment of the invention.

A still further embodiment with a minor change is shown in FIG. 9. In this embodiment, the first input to the adder 60' is again taken from the output of the unit delay memory 58', and the adder 70 is replaced by a subtractor 72 so that the difference $\Delta f_c - \Delta f_p$ between the current value of the loop filter output $\Delta f_c$ and the previous value $\Delta f_p$ is subtracted from the output of the multiplier 74 rather than added to it. This implementation is easier to handle in hardware.

The DPLL behavior in FIG. 9 is almost the same as FIG. 8. The closed loop frequency response is:

$$H(z) = \frac{H_l(Z^{-1})\left(\frac{(N_1-1)+(N_1+1)Z^{-1}}{2N_1}\right)}{1+\frac{N_1-1}{2N_1}H_l(Z^{-1})-\left(1-\frac{N_1+1}{2N_1}H_l(Z^{-1})\right)Z^{-1}}$$

The embodiment shown in FIG. 9 also updates the phase of the HDCO 22 directly every clock cycle of the SDCO 18 through sample-hold register 76. The SDCO 18 generates a phase value that is input to the sample-hold register 76, where it is used to update the phase of the HDCO 22 on each clock cycle at the rate $f_s$ of the HDCO 22 by changing the value loaded in the counter. This update allows for the compensation of any precision loss during the accumulation process in the hardware.

Aspects of the invention may include the use of an anti-image filter in a DPLL clock synthesiser, the architecture for SDCO and HDCO synchronization with anti-image filter present, an anti-image filter that leads a stable DPLL design, and simplified hardware with an anti-image filter running at an intermediate low clock rate.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A frequency synthesizer, comprising:
   a hardware digital controlled oscillator (HDCO) running at a first clock rate $f_S$ for generating an output clock signal in response to a control input;
   a digital phase locked loop (DPLL) responsive to a reference input sampled at a second clock rate $f_{samp}$, said first clock rate $f_S$ being N times greater than said second clock rate $f_{samp}$, and said DPLL comprising a loop filter and a software digital controlled oscillator (SDCO);
   a first, first order linear interpolation anti-imaging filter running at a clock rate higher than said second clock rate $f_{samp}$ coupled to an output of said loop filter for providing said control input to said HDCO; and
   a second, first order linear interpolation anti-imaging filter running at said second clock rate coupled to the output of said loop filter to provide an input to said SDCO.

2. The frequency synthesizer of claim 1, wherein said first, first order linear interpolation anti-imaging filter comprises an accumulator and first adder for incrementally adding fractions of a difference between a current sample and previous sample output of said loop filter to the previous sample output to provide inputs to said HDCO at said higher clock rate.

3. The frequency synthesizer of claim 2, wherein said accumulator comprises a first delay memory and second adder.

4. The frequency synthesizer of claim 3, wherein said higher clock rate is said first clock rate $f_s$.

5. The frequency synthesizer of claim 4, wherein said second, first order linear interpolation anti-imaging filter comprises an averaging block for obtaining an average of the previous and current sample outputs of the loop filter and a multiplier for multiplying the average by a factor N.

6. The frequency synthesizer of claim 5, wherein said averaging block comprises a second delay memory, a third adder for adding the current output sample of said loop filter to said previous output sample, and a divider-by-2.

7. The frequency synthesizer of claim 6, wherein said second delay memory provides an input via a first sample-hold register to said first adder, and an input to said accumulator via a fourth adder whose other input receives the current output sample of said loop filter, a divider-by-N block, and a second sample-hold register.

8. The frequency synthesizer of claim 2 or 3, wherein said accumulator runs at an intermediate rate $f_{S1}$, which is intermediate between said first clock rate $f_S$ and said second clock rate $f_{samp}$, and the output of said first adder is applied to said HDCO through an upsampling sample-hold register to bring the output of said first adder up to said first clock rate.

9. The frequency synthesizer of claim 8, wherein $f_s/f_{s1}=M$, and $N1=N/M$, and $N=f_s/f_{samp}$, and said second, first order linear interpolation anti-imaging filter comprises an averaging block for obtaining scaled average of the previous and current sample outputs of the loop filter and a multiplier for multiplying the average by M.

10. The frequency synthesizer of claim 9, wherein said averaging block comprises a second delay memory, a third adder for adding the current output sample of said loop filter to said previous output sample, and multiplier for multiplying the output of said third adder by a scaling factor N1, a combiner for combining the output of said multiplier with the difference between the current sample and the previous sample, and a divider for dividing the output of said combiner by a factor of 2.

11. The frequency synthesizer of claim 9, wherein said combiner is an adder.

12. The frequency synthesizer of claim 9, wherein said combiner is a subtractor.

13. The frequency synthesizer of claim 12, wherein said SCDO provides a phase update inputs to said HDCO via a sample-hold register.

14. The frequency synthesizer of claim 10, wherein said second delay memory provides an input via a first sample-hold register to said first adder, and an input to said accumulator via a fourth adder whose other input receives the current output sample of said loop filter, a divider-by-N block, and a second sample-hold register.

15. A method of synthesizing a clock signal from a reference signal, comprising:
sampling said reference signal at a clock rate $f_{samp}$;
locking a digital phase locked loop (DPLL) including a loop filter and software digital controlled oscillator (SDCO) to said sampled reference signal;
generating said clock signal from a hardware digital controlled oscillator (HDCO) running at a clock rate $f_S$, where $f_S = N*f_{samp}$;
deriving a control input for said HDCO by passing an output of said loop filter through a first, first order linear interpolation anti-imaging filter running at a clock rate higher than said clock rate $f_{samp}$; and
passing the output of said loop filter through a second, first order linear interpolation anti-imaging filter running at said clock rate $f_{samp}$ to provide an input to said SDCO.

16. The method of claim 15, comprising incrementally adding fractions of a difference between a current sample and previous sample output of said loop filter to the previous sample output to provide inputs to said HDCO at said higher clock rate.

17. The method of claim 16, wherein said higher clock rate is said clock rate $f_S$.

18. The method of claim 17, wherein said second, first order linear interpolation anti-imaging filter averages the previous and current sample outputs of the loop filter and multiplies the average by a scaling factor N.

19. The method of claim 18, wherein the difference between a current sample and previous sample output is divided by a scaling factor N and upsampled to provide an input to said first, first order linear interpolation anti-imaging filter.

20. The method of claim 16, wherein said first, first order linear interpolation anti-imaging filter includes an accumulator running at an intermediate rate $f_{S1}$, which is intermediate between said clock rate $f_S$ and said clock rate $f_{samp}$, and the output of said accumulator after being added to the difference between the current sample and previous sample is upsampled to said clock rate $f_s$.

21. The method of claim 20, wherein $f_s/f_{s1}=M$, and $N1=N/M$, and $N=f_s/f_{samp}$, and said second, first order linear interpolation anti-imaging filter obtains the scaled average of the previous and current sample outputs of the loop filter and multiplies the average by M.

22. The method of claim 21, wherein said SCDO provides phase update inputs to said HDCO via a sample-hold register.

* * * * *